United States Patent [19]
Appelman et al.

[11] Patent Number: 5,920,771
[45] Date of Patent: Jul. 6, 1999

[54] METHOD OF MAKING ANTIFUSE BASED ON SILICIDED SINGLE POLYSILICON BIPOLAR TRANSISTOR

[75] Inventors: Petrus T. Appelman, St. Catharines; Andrew V. C. Cervin-Lawry, Crescent; James D. Kendall, Burlington; Efim Roubakha, Hamilton, all of Canada

[73] Assignee: Gennum Corporation, Ontario, Canada

[21] Appl. No.: 08/820,475

[22] Filed: Mar. 17, 1997

[51] Int. Cl.$^6$ ................................................ H01L 21/82
[52] U.S. Cl. ........................ 438/131; 438/467; 438/600
[58] Field of Search ................................ 438/131, 130, 438/467, 215, 600

[56] References Cited

U.S. PATENT DOCUMENTS

| | | | |
|---|---|---|---|
| 3,742,592 | 7/1973 | Rizzi et al. | 29/574 |
| 4,651,409 | 3/1987 | Ellsworth et al. | 29/576 |
| 5,019,878 | 5/1991 | Yang et al. | 357/23.3 |
| 5,166,556 | 11/1992 | Hsu et al. | 307/465 |
| 5,208,177 | 5/1993 | Lee | 437/47 |
| 5,233,217 | 8/1993 | Dixit et al. | 257/530 |
| 5,298,784 | 3/1994 | Gambino et al. | 257/529 |
| 5,316,971 | 5/1994 | Chiang et al. | 437/170 |
| 5,565,702 | 10/1996 | Tamura et al. | 257/530 |
| 5,623,387 | 4/1997 | Li et al. | 361/56 |

FOREIGN PATENT DOCUMENTS

| | | | |
|---|---|---|---|
| 2 222 024 | 8/1988 | United Kingdom | H01L 21/82 |
| WO 85/03599 | 2/1985 | WIPO | H01L 29/68 |

OTHER PUBLICATIONS

Shacaham–Diamond, Filament Formation and the Final Resistance Modeling in Amorphous–Solcon Vertical.

Programmable Element, IEEE Transactions on Electron Devices 40(1993) Oct., No. 10.

George Erdi, "A Precision Trim Technique for Monolithic Analog Circuits", *IEEE Journal of Solid–State Circuits*, vol. SC–10, No. 6, Dec., 1975, pp. 412–416.

W.W. Brockhoff, Electrically Shorted Semiconductor Junctions Utilized as Programmable Read Only Memory Elements, pp. 202–206, date unknown.

*Primary Examiner*—Joni Chang
*Attorney, Agent, or Firm*—Bereskin & Parr

[57] ABSTRACT

An improved antifuse which employs the base-emitter junction of a silicided single polysilicon bipolar transistor. The distance between the base metal and emitter metal is shortened and results from self aligning process steps rather than lithographic steps, resulting in a lower and better controlled programming voltage, programming energy and ON state resistance. Typically the conductive filament formed in the new antifuse is about 0.65 microns long and is formed by a voltage pulse having a relatively slow rise time (e.g. 150 microseconds), resulting in improved properties which provide advantages in circuit design and in manufacturing circuits using the new antifuse.

7 Claims, 6 Drawing Sheets

METHOD OF MAKING ANTIFUSE BASED ON SILICIDED SINGLE POLYSILICON BIPOLAR TRANSISTOR

FIELD OF THE INVENTION

This invention relates to programmable antifuses and to methods of making the same.

BACKGROUND OF THE INVENTION

Antifuses have been known for some time and are disclosed for example in U.S. Pat. Nos. 3,191,151; 3,742,592; 5,019,878; and 5,298,784. Antifuses are devices which have a high impedance before programming and a low impedance after programming, and are used widely in integrated circuit structures. An antifuse is the converse of a fuse, which can be employed in a similar manner. Use of an antifuse permits the tuning of various analog circuit parameters, the programming of digital logic, and the selection of certain pieces of redundant circuitry. An exemplary application for antifuses (given by way of example only) is to switch desired resistances into a voltage controlled oscillator (VCO), so that the center frequency and range of the VCO will be within desired specifications.

Antifuses can be formed from transistor or diode structures which normally have a high impedance when reverse biased. The appropriate PN junction of the device can be shorted by applying a large reverse bias, causing part of the junction to melt and causing the metal which contacts the junction to flow into the molten region, thereby creating a low impedance metal filament.

Conventional antifuse structures typically require a relatively high programming voltage and energy, which may cause damage to the remainder of the integrated circuit in which the antifuse is located. It is therefore an object of the invention to provide an improved antifuse structure, and a method of forming an antifuse, which require a lower programming voltage and energy than have typically been the case in the past.

BRIEF SUMMARY OF THE INVENTION

Accordingly, in one of its aspects the invention provides A method of making an antifuse comprising:

(a) selecting a single polysilicon bipolar transistor comprising:
  (i) a collector layer,
  (ii) a base layer overlying said collector layer and having an upper surface,
  (iii) an emitter structure overlying said base layer, said emitter structure projecting above said base layer and having a sidewall extending above said base layer, said emitter structure also having an upper surface,
  (iv) a narrow oxide spacer ring surrounding said sidewall of said emitter structure,
  (v) a first conductive silicide layer on said upper surface of said base layer, surrounding said spacer ring, and a second conductive silicide layer on said upper surface of said emitter structure, (b) applying a pulse between said first and second conductive silicide layers to form a filament between said first and second conductive layers, said filament extending from said second conductive layer down said sidewall of said emitter structure and under said spacer ring to said second conductive layer.

In another aspect the invention provides an antifuse comprising:

(a) a silicided single polysilicon bipolar transistor structure comprising:
  (i) a collector layer,
  (ii) a base layer overlying said collector layer and having an upper surface,
  (iii) an emitter structure overlying said base layer, said emitter structure projecting above said base layer and having a sidewall extending above said base layer, said emitter structure also having an upper surface,
  (iv) a narrow oxide spacer ring surrounding said sidewall of said emitter structure,
  (v) a first conductive silicide layer on said upper surface of said base layer, surrounding said spacer ring, and a second conductive silicide layer on said upper surface of said emitter structure, (b) and a conductive filament extending between said first and second conductive layers, said filament extending from said first conductive layer down said sidewall of said emitter structure and under said spacer ring to said second conductive layer.

Further objects and advantages of the invention will appear from the following description, taken together with accompanying drawings.

DETAILED DESCRIPTION OF PREFERRED EMBODIMENT

Figure 1:
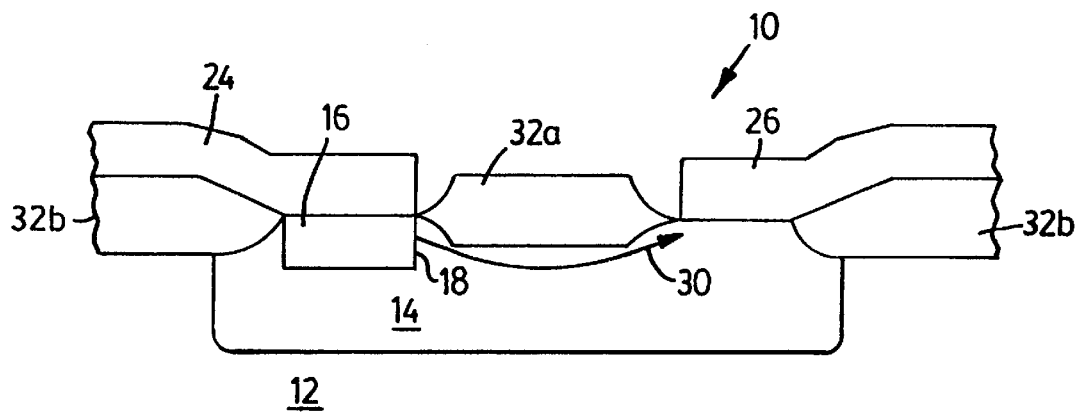
FIG. 1 is a cross-sectional view showing a prior art antifuse.

Reference is first made to FIG. 1, which shows a planar diffused bipolar transistor 10 of the kind shown in U.S. Pat. No. 3,191,151, and having a collector 12, a base 14 and an emitter 16. When reverse biased, the base-emitter junction 18 serves as an approximation to an electrical open circuit, thereby constituting the OFF state of the antifuse.

Figure 2:
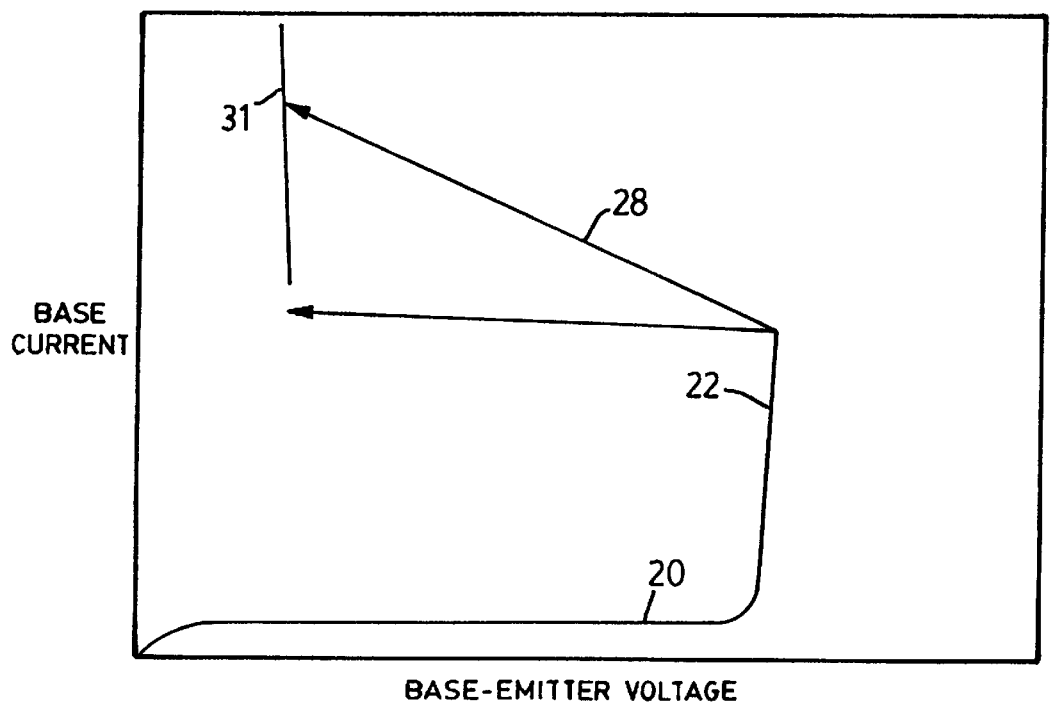
FIG. 2 is a graph showing the breakdown characteristic of the base emitter diode of the FIG. 1 structure.

When a large reverse bias is applied to the base emitter junction 18, electrical breakdown occurs as shown in FIG. 2. In FIG. 2, which plots base current against base-emitter voltage, the normal reverse leakage current under reverse bias is indicated at 20. When the base-emitter voltage becomes high enough, electrical breakdown occurs, as indicated at 22. As the electrical breakdown continues, heating occurs, causing a secondary thermal breakdown during which part of the base-emitter junction 18 melts. The metal 24, 26 contacting the base and emitter regions then diffuses into the molten region, causing effectively a short circuit so that the voltage across the junction drops and the current rises, as indicated by region 28 in FIG. 2. Upon solidification of the molten region, a metal filament indicated by arrow 30 (FIG. 1) is formed between the metallic base and emitter contacts 24, 26. The filament serves as an approximation to an electrical short, and constitutes the ON state of the antifuse. This is indicated by region 31 of FIG. 2.

A problem with the transistor 10 shown in FIG. 1 used as an antifuse, is that the transistor 10 is formed primarily by lithographic steps, the accuracy of which is inherently limited. For example, the base 14 and emitter 16 are superimposed on the collector 12, and the oxide layers 32a, 32b are formed, all through the use of lithographic steps. There are natural limits to the precision of these steps. Therefore, in practice, the total length of the metal filament indicated by arrow 30 is typically between 4 and 5 microns. The voltage, current and total energy required to create a filament of this length are relatively high, resulting in the potential for damage to surrounding circuit elements.

In a preferred embodiment of the invention, the base emitter junction of a silicided single polysilicon bipolar transistor 40 (FIG. 3) is used as an antifuse. As will be discussed, this arrangement allows the distance between the metals on the base and emitter regions to be reduced by approximately a factor of five, and this distance is better controlled since it is defined by self aligned processing steps. The shorter distance between the base and emitter metals in the silicided single polysilicon bipolar transistor 40 serves to lower the applied voltage and energy required to switch the antifuse from its OFF state to its ON state by a factor of approximately two, as compared to a planar diffused bipolar transistor. As mentioned, the lower programming voltage is a substantial advantage, because in the process of programming the antifuse, the surrounding circuitry is much less likely to be damaged.

In a preferred embodiment, the transistor 40 is constructed as follows. Firstly, the base region 42 (shown as a P-type region but the types can be reversed) is implanted into an n-epitaxial or n-well region 44 of monosilicon. Next, n-type polysilicon is deposited and patterned on top of the base region 42 to form the emitter 46. These steps are, as usual, lithographic steps.

Next, a layer of silicon dioxide (not shown) is deposited by chemical vapor deposition and is then subjected to anisotropic plasma etching, resulting in a ring-shaped sidewall oxide spacer 50 encircling the sidewall 52 of the emitter 46. It is a well known feature of anisotropic etching of an oxide layer (as shown by U.S. Pat. No. 5,019,878) that the thinner portions of the oxide layer are removed during the etching process, but that an oxide ring remains from the thicker portion where a feature projects above the surrounding surface. The radial dimensions of the sidewall ring 50 (as shown by dimension "r" in FIG. 3) are well defined by the process step and are not defined by a lithographic step.

Next, the exposed emitter polysilicon 46, and the base silicon 42 (which as mentioned is monocrystalline silicon) are silicided by depositing one of the following metals at elevated temperature: Co, Mo, Ni, Pt, Ta, Ti or W (Pt is shown as an example). Such siliciding is well known in the art. At elevated temperatures, these metals react with all exposed silicon to form a silicide, but they do not react with the silicon dioxide layer or sidewall ring 50. Consequently, etchants can be used to remove the unreacted metal and leave the silicide in place. By this process, the transistor 40 shown in FIG. 3 is fabricated.

Figure 3:
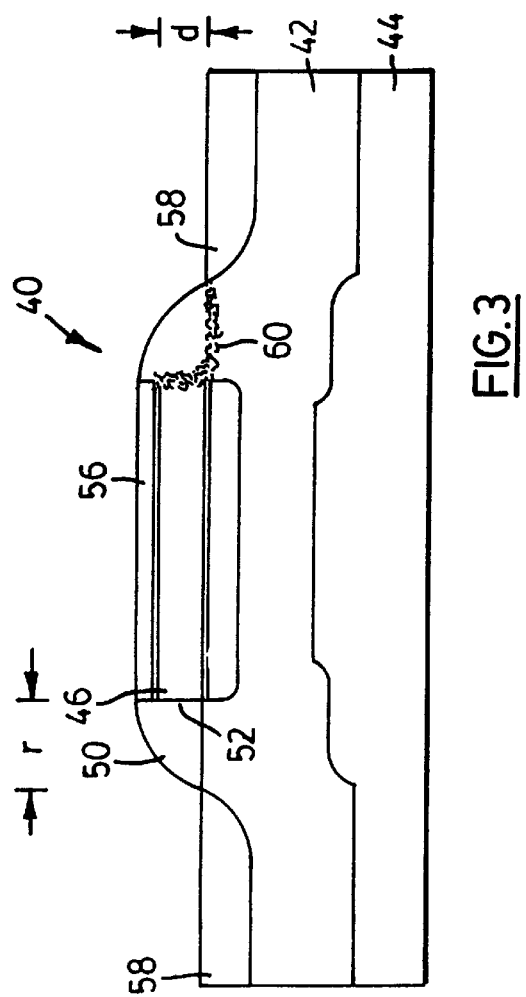
FIG. 3 is a cross-sectional view showing an antifuse according to the invention, with the left side showing the structure before programming and the right side showing the structure after programing.

As shown, the transistor 40 in FIG. 3 now has a low resistivity contact (e.g. of platinum silicide) 56 on the emitter 46, and a surrounding low resistivity contact layer 58 (e.g. of platinum silicide) on the base 42, with only a short distance between these two contacts, defined by the oxide ring or sidewall spacer 50.

When a controlled programming voltage is applied between the contacts 56, 58, electrical and then thermal breakdown occur between the base 42 and the emitter 46, causing a silicide filament 60 (e.g. platinum silicide) to grow. Typically the height or dimension "d" of the sidewall oxide spacer 50 is about 0.4 microns, and its thickness in the radial dimension "r" is about 0.25 microns, so the total length of the filament 60 is about 0.65 microns, while its width is typically about 0.35 microns. This length (0.65 microns) is far less than the length of the filament required in a conventional bipolar transistor, and therefore requires less energy to produce.

Figure 4:
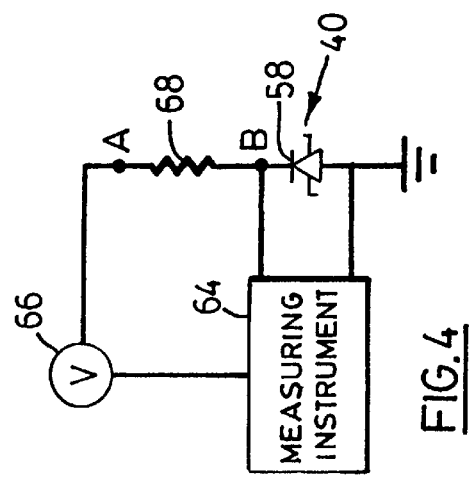
FIG. 4 is a schematic showing the arrangement used to program antifuses of the invention.

A simple circuit used to program antifuses of the invention is shown in FIG. 4. As shown, firstly a measuring instrument 64 is connected to transistor 40 (drawn for convenience as a zener diode) to measure the emitter-base breakdown voltage of transistor 40. Next, a voltage pulse was applied from voltage supply 66 through a 250 ohm current limiting resistor 68 to the emitter-base junction. In the specific transistors 40 used, it was found that the breakdown voltage was approximately 5 volts (this varied slightly from device to device), and that a voltage pulse of 9 volts superimposed on the breakdown voltage (total approximately 14 volts) was optimum for producing the filament 60.

Figure 5A:
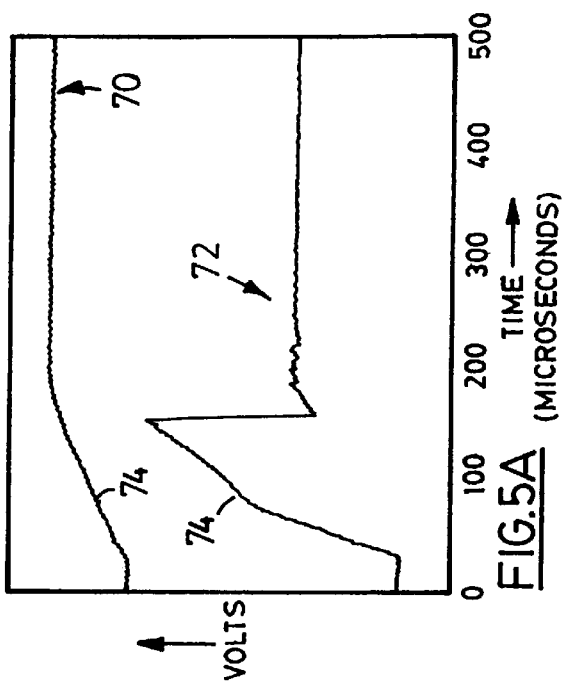
FIG. 5A is a plot showing the voltage pulse applied to program the antifuse device of FIG. 2 and also showing the voltage at the input of the device.

FIG. 5A shows a plot of the voltage pulse versus time used to form the antifuse (i.e. the filament 60). The top trace 70 shows the pulse applied by the voltage source 66 at terminal A of the current limiting resistor 68. The bottom trace 72 shows the voltage at the input terminal 58 of the device, namely the emitter-base voltage. The voltage pulse was of about 5 milliseconds duration, with a rise time (shown by curve portion 74) of approximately 150 microseconds. It will be seen from the portion 74 of plots 70, 72 that the entire antifuse process (the formation of the filament 60) occurs within the short rise time of the pulse 70.

Figure 5B:
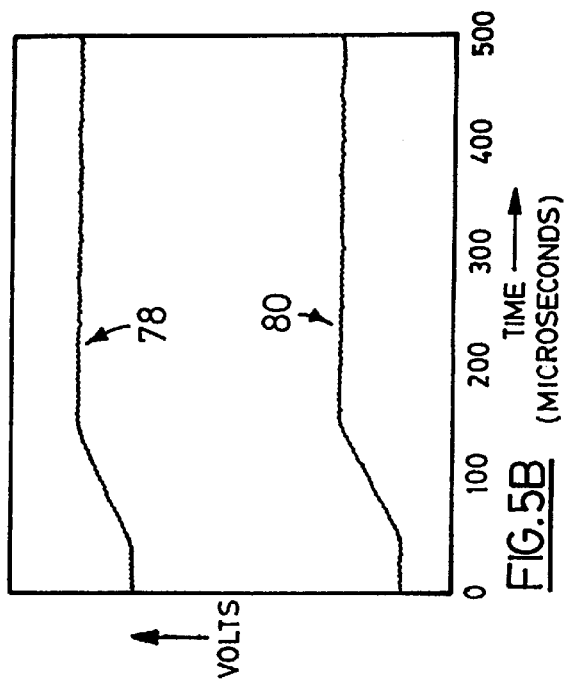
FIG. 5B is a plot similar to that of FIG. 5A but showing voltages applied after the device has been programmed.

FIG. 5B shows the same pulse applied to the device 40 after formation of the antifuse. The top trace 78 shows the voltage pulse applied to the top terminal A, while the lower trace 80 shows the voltage pulse applied to the emitter 58, i.e. the emitter-base voltage. It will be seen that no further changes to the junction are observed from this pulse, i.e. the filament 60 has already been formed and no further filaments are formed.

Figure 6:
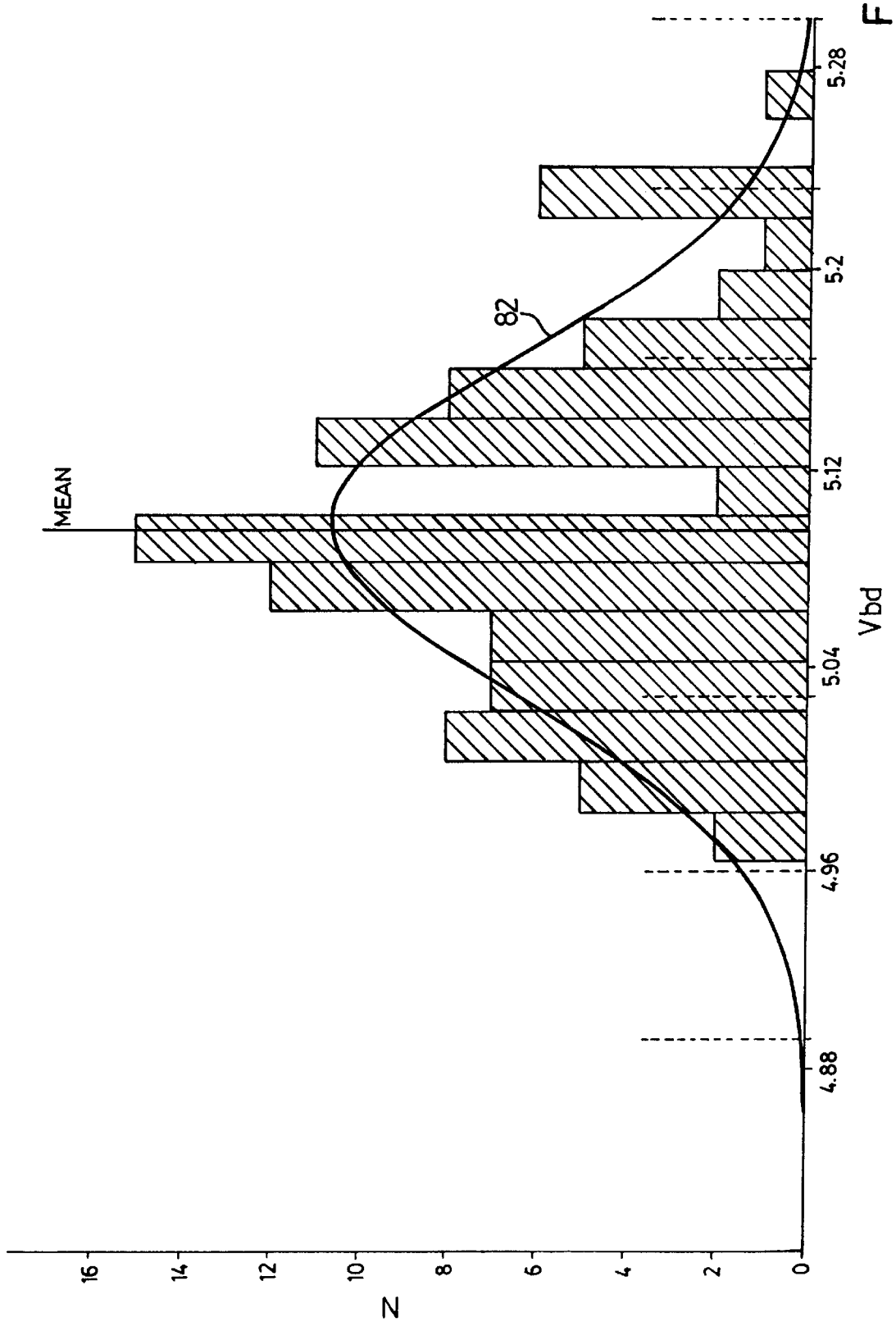
FIG. 6 shows the distribution of the emitter-base breakdown voltages for a set of functional discrete transistors of the kind shown in FIG. 2, before programming.

FIG. 6 displays a curve 82 showing the emitter-base breakdown voltage distribution for a number of functional discrete transistors 40 before the filament forming voltage pulse 74 was applied. It will be seen that the mean emitter-base breakdown voltage was approximately 5 volts, but that there was (as would be expected) a fairly substantial variation from this level. The voltage pulse applied was, as mentioned, 9 volts plus the measured emitter-base breakdown voltage.

Figure 7:
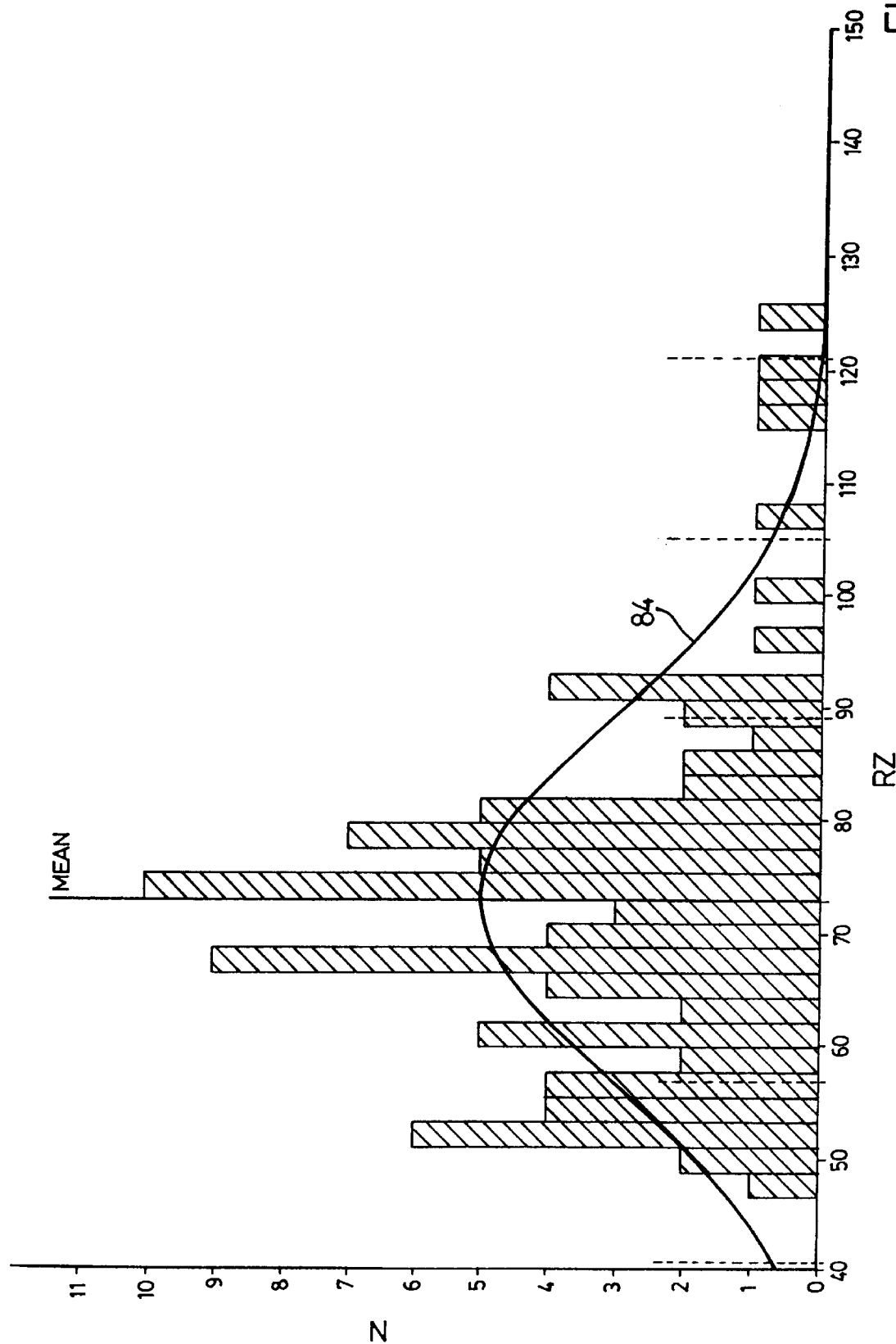
FIG. 7A shows the impedances of the devices referred to in connection with FIG. 6, after programming.

After formation of the filaments 60 on a number of devices 40, voltage measurements of the collector/emitter-base junctions were made at bias current levels of 50, 100, 150 and 200 microamperes, and impedances were calculated. FIG. 7 shows the data for the impedances at a 50 microampere bias current with the number of devices plotted on the vertical axis and the impedance on the horizontal axis. Curve 84 plots the average of the impedances found. The mean impedance was approximately 73 ohms with a standard deviation of 16 ohms. This was a relatively low impedance, bearing in mind that the impedance before formation of the filament 60 was nearly that of an open circuit.

Figure 8:
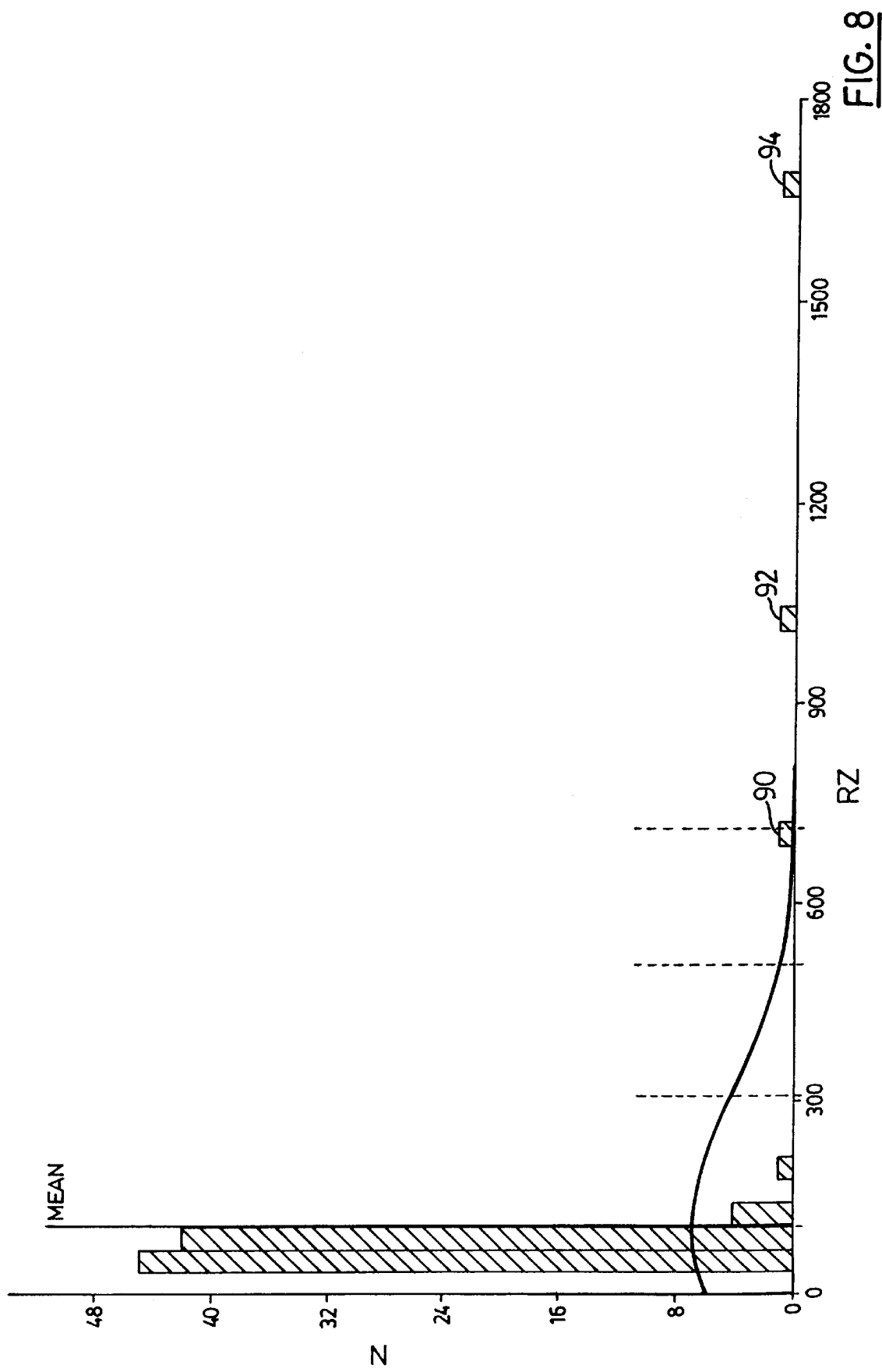
FIG. 8 shows the entire population of the sample programmed.

FIG. 8 shows the entire population of the sample shown in FIG. 7. The number of devices appears on the vertical axis and the impedance on the horizontal axis. It will be seen that there are three outlying devices 90, 92 and 94 between 600 and 800 ohms. This indicates that a small percentage of the devices subjected to the filament forming voltage pulse will exhibit a partial antifuse characteristic. This appeared to indicate process flaws or structural differences in the transistors in question and is indicative of some yield loss during production, in the samples tested.

Figure 9:
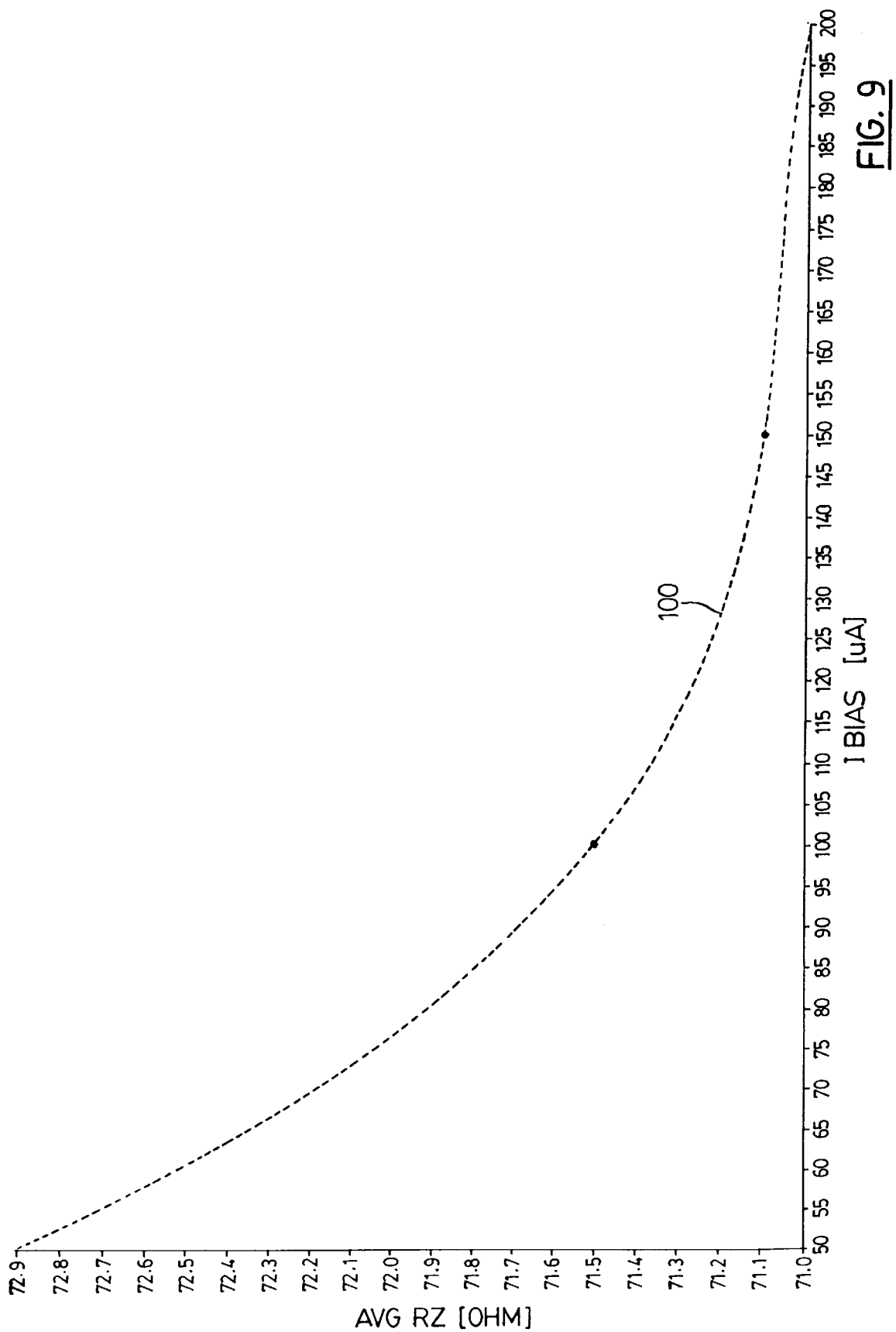
FIG. 9 shows the mean impedance after programming at a range of bias currents.

FIG. 9 plots at 100 the mean impedance (on the vertical axis) at each bias current (on the horizontal axis) for typical devices after the antifuse filament 60 was formed. It will be seen that the impedance drops from 72.9 ohms at 50 microamps bias current to 70.9 ohms at 200 microampere bias current. This relatively small variation does not cause difficulty in use.

With the devices tested, it was found that pulses of less than 12 volts total (reverse breakdown voltage of 5 volts plus a 7 volt pulse superimposed) were not sufficient to create the antifuse filament, while pulses greater than about 15 volts total (5 volts breakdown voltage plus 10 volts superimposed) tended to create junctions having much higher resistances (more than 300 ohms and increasing with voltage). As mentioned, pulses of approximately 14 volts (9 volts plus the breakdown voltage) were ideal.

It was also found that the average energy during the rise time part of the pulse, where the filament was actively formed, was approximately 6.6 microjoules. Thus, it will be seen that only a relatively small amount of energy is needed to program the devices.

In some tests, a rise time of less than one-tenth the rise time disclosed (approximately 12 microseconds instead of 150 microseconds) was used, and the antifuses produced tended to have higher impedances and a broader distribution of impedances. It is not known at the present time whether the longer rise time of the voltage pulses used was beneficial in forming the antifuse filaments 60, but it is suspected that the relatively slow rise time may have been beneficial since it allowed the filaments 60 an optimal time to form.

While preferred embodiments of the invention have been described, it will be realized that various changes may be made within the scope of the invention. For example a variety of semiconductors and metals can be used beyond those specified, and the region specified as p and n can take on the opposite type if desired.

We claim:

1. A method of making an antifuse comprising:
   (a) selecting a single polysilicon bipolar transistor comprising:
      (i) a collector layer,
      (ii) a base layer overlying said collector layer and having an upper surface,
      (iii) an emitter structure overlying said base layer, said emitter structure projecting above said base layer and having a sidewall extending above said base layer, said emitter structure also having an upper surface,
      (iv) a narrow oxide spacer ring surrounding said sidewall of said emitter structure,
      (v) a first conductive silicide layer on said upper surface of said base layer, surrounding said spacer ring, and a second conductive silicide layer on said upper surface of said emitter structure,
   (b) applying a pulse between said first and second conductive silicide layers to form a filament between said first and second conductive layers, said filament extending from said second conductive layer down said sidewall of said emitter structure and under said spacer ring to said second conductive layer.

2. A method according to claim 1 wherein said pulse is a voltage pulse.

3. A method according to claim 2 and including the step of measuring a breakdown voltage of a junction formed by said emitter structure and said base layer, and forming said voltage pulse from a sum of said breakdown voltage and another voltage.

4. A method according to claim 3 wherein said another voltage is approximately 9 volts.

5. A method according to claim 4 wherein said voltage pulse has a rise time of approximately 150 microseconds and said filament is formed during said rise time.

6. A method according to claim 5 wherein said filament is approximately 0.65 microns in length.

7. A method according to claim 6 wherein a height of said spacer ring is approximately 0.4 microns and a width of said spacer ring is approximately 0.25 microns.

* * * * *